(12) United States Patent
Van Peski et al.

(10) Patent No.: US 7,128,427 B2
(45) Date of Patent: Oct. 31, 2006

(54) METHOD AND APPARATUS FOR FLUID HANDLING IN IMMERSION LITHOGRAPHY

(75) Inventors: Christian K. Van Peski, Cedar Creek, TX (US); Walter J. Trybula, Austin, TX (US)

(73) Assignee: Sematech, Inc., Austin, TX (US)

( * ) Notice: Subject to any disclaimer, the term of this patent is extended or adjusted under 35 U.S.C. 154(b) by 0 days.

(21) Appl. No.: 10/981,884

(22) Filed: Nov. 5, 2004

(65) Prior Publication Data

US 2006/0098297 A1 May 11, 2006

(51) Int. Cl.
*G02B 3/12* (2006.01)
(52) U.S. Cl. .................................. 359/509; 359/507
(58) Field of Classification Search ................ 359/228, 359/507, 509, 665, 666
See application file for complete search history.

(56) References Cited

U.S. PATENT DOCUMENTS

| | | | | |
|---|---|---|---|---|
| 4,958,919 | A * | 9/1990 | Sigler | 359/665 |
| 6,788,477 | B1 * | 9/2004 | Lin | 359/820 |
| 6,891,596 | B1 * | 5/2005 | Rostalski et al. | 355/53 |
| 2003/0174408 | A1 | 9/2003 | Rostalski et al. | 359/642 |
| 2004/0075895 | A1 | 4/2004 | Lin | 359/380 |
| 2004/0114117 | A1 | 6/2004 | Bleeker | 355/53 |
| 2004/0118184 | A1 | 6/2004 | Violette | 73/37.5 |

OTHER PUBLICATIONS

Burnett, "Optical properties of water for 193 nm immersion lithography," International SEMATECH Immersion Lithography Workshop III, (2003).

Chang, "Thermomechanical response of device wafers for next-generation lithography," Ph.D. Dissertation, Mechanical Engineering, University of Wisconsin, Madison, WI, 2003.
De Gennes, "Wetting: statics and dynamics," *Reviews of Modern Physics*, 57:827-863, 1985.
Dussan "On the spreading of liquids on solid surfaces: static and dynamic contact lines," *Annual Review of Fluid Mechanics*, 11:371-400, 1979.
Incropera et al., *Fundamentals of Heat and Mass Transfer, Third Edition*, John Wiley and Sons, New York, NY, 1990.
Switkes et al., "Resolution enhancement of 157 nm lithography by liquid immersion," *Journal of Microlithography, Microfabrication, and Microsystems*, 1:225-228, 2002.
Wei et al., "Preliminary microfluidic simulations for immersion lithography," *Proceedings of SPIE Optical Microlithography XVI*, 5040:713-723, 2003.
Wei et al., "Simulating fluid flow characteristics during the scanning process for immersion lithography," *J. Vac. Sci. Thenol. B*, (2003) (in pres).

* cited by examiner

*Primary Examiner*—Hung Xuan Dang
*Assistant Examiner*—Joseph Martinez
(74) *Attorney, Agent, or Firm*—Fulbright & Jaworski LLP (57) ABSTRACT

Apparatus and method for a substantially distortion free immersion lithography is provided. The apparatus includes a lens element, an outlet for drawing immersion fluid towards the lens element, and a collector ring coupled to the central outlet for removing the immersion fluid. The method includes positioning a lens element relative to a wafer to provide a space between the lens element and wafer, introducing immersion fluid to that space, and drawing the immersion fluid from that space to minimize gas bubbles in the immersion fluid, and repeating the introducing and drawing steps to maintain the flow of the immersion fluid during a lithography process.

40 Claims, 6 Drawing Sheets

METHOD AND APPARATUS FOR FLUID HANDLING IN IMMERSION LITHOGRAPHY

BACKGROUND OF THE INVENTION

1. Field of the Invention

The present invention relates generally to semiconductor fabrication, and more particularly to immersion lithography.

2. Description of Related Art

Semiconductor fabrication processes generally include an optical lithography step where light passes through a mask that includes a pattern. The pattern is focused by a lens and is projected onto the surface of a semiconductor wafer. The pattern may be a particular layer of an integrated circuit including transistor structures, contacts, conductors, and so forth. As feature sizes of devices continue to decrease, the resolution of the lithography process becomes more important. The resolution of the lithography process, in particular the thickness of the conductors and spaces between the conductors, is proportional to the wavelength of light used for patterning, and inversely proportional to the numerical aperture of the lens. Ideally, the resolution of the lithography process is improved when the wavelength is small and the numerical aperture is large.

However, as wavelengths decrease to less than 193 nanometers, the light becomes absorbed, rather than passed, by the fused silica or amorphous silicon dioxide lenses. As such, to maximize the resolution, the numerical aperture needs to be maximized. The numerical aperture may be characterized by the following equation:

$$\text{Numerical Aperture} = n \cdot \sin\theta \qquad \text{Eq. 1}$$

where n is the refractive index of the medium between the lens and the wafer and $\theta$ is the maximum half-angle formed by the light focused on the wafer. In optical lithography, the light passes through air which has a refractive index of 1 and an overall numerical aperture between 0 and 1. Therefore, to maximize the numerical aperture and resolution of the lithography process, the medium in which the light passes through needs to increase.

Immersion lithography is a technique in which lithographic exposure is performed with an immersion fluid, such as purified water, introduced between the lens and wafer. Typically, a small, planar layer of water that covers the section of the wafer to be exposed is introduced through an opening of a housing containing a planar lens element. After exposure, the water is suctioned out of the housing by a vacuum. By using immersion fluid, and in particular, water, as a medium between the light source and the wafer, the numerical aperture may be increased by a factor of up to 1.44 (the refractive index of water). However, a planar final lens surface in immersion lithography limits the design for a higher numerical aperture. As such, there is a need for a higher numerical aperture lens element.

The referenced shortcomings are not intended to be exhaustive, but rather are among many that tend to impair the effectiveness of previously known techniques concerning immersion lithography; however, those mentioned here are sufficient to demonstrate that the methodologies appearing in the art have not been altogether satisfactory and that a significant need exists for the techniques described and claimed in this disclosure.

SUMMARY OF THE INVENTION

The present invention provides methods and apparatuses for increasing the numerical aperture in immersion lithography by using non-planar lens element. Further, the present invention provides reducing or substantially eliminating gas bubbles present in the space between a lens element a wafer as well as gas bubbles in the immersion fluid.

In one respect, the invention includes an immersion lithography apparatus with a non-planar lens such as a concave lens element. In some embodiments, the lens element includes a non-planar doublet lens element. Coupled to the lens element is an outlet for drawing immersion fluid towards the lens element. In some embodiments, the central outlet passes through the lens element and is positioned relative to a top surface of a lens element such that the immersion fluid flows through the lens element. In other embodiments, the central outlet below a bottom surface of the lens element.

The apparatus may also include a collector ring coupled to the lens element for removing the immersion fluid. At least one substantially radial passage is provided for transporting the immersion fluid from the central outlet to the collector ring. In some embodiments the at least one substantially radial passage includes a plurality of passages that are positioned relative to a surface of the lens element, such as a top or bottom surface. In other embodiments, the plurality of radial passages may be included in a surface of the lens element, via, for example, etching.

The lens element may include a first and second lenses spaced apart from one another. The outlet draws the immersion fluid from the space between the lens element and the wafer into a space between the first and second lens. A plurality of holes in the collector ring drains the immersion fluid from the space between the first and second lens.

A method in accordance with the present invention includes steps for maintaining flow of an immersion fluid during a lithography process. A lens element is provided and may be positioned relative to a wafer to form a space between the lens element and the wafer. The lens element may be a single, non-planar lens element or a non-planar, doublet lens element. Alternatively, the lens element may be include two, non-planar lens elements spaced apart from one another.

In some embodiments, the method provides steps for drawing air from the space between the lens element and the wafer and introducing immersion fluid to the space between the lens element and the wafer. A central outlet may be provided to draw existing gas bubbles in the lens element and the wafer. Further, the immersion fluid may be drawn towards the lens element to minimize gas bubbles in the immersion fluid via the central outlet.

The method also provides passages to draw the immersion from the outlet. The passages may be positioned relative to a top or bottom surface of the lens element. Alternatively, the method includes a step of etching the passages into the lens element. During an immersion lithography process, the method provides a step for maintaining the flow of the immersion fluid. In one embodiment, the step of drawing the immersion fluid from the space between the lens element and wafer and the step of drawing the immersion fluid from the outlet is repeated until completion of the immersion lithography process.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DESCRIPTION OF ILLUSTRATIVE EMBODIMENTS

The invention and the various features and advantageous details are explained more fully with reference to the non-limiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions and/or rearrangements within the spirit and/or scope of the underlying inventive concept will become apparent to those skilled in the art from this disclosure.

The present invention provides apparatuses and methods for substantially eliminating bubbles resulting from immersion lithography processes that use non-planar lens elements. Further, the present invention may be used to achieve higher numerical aperture lenses for wavelengths of approximately 193 nanometers or less in immersion lithography.

According to some embodiments of the present invention, a non-planar lens element may be coupled to a central outlet, where the central outlet may draw air from a space between the non-planar lens and a wafer. Additionally, the central outlet may also draw immersion fluid from a space between the lens element and a wafer towards the lens element. As used throughout the disclosure, non-planar lens elements may include high numerical aperture lens such as hemispherically-shaped lens elements, for example, concave lens elements.

Figure 1A:
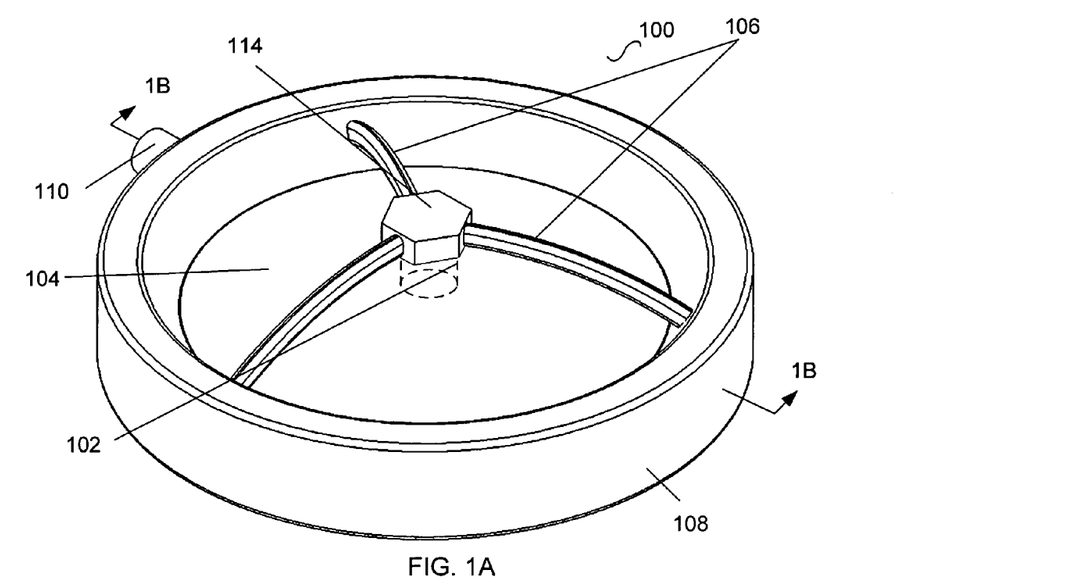
FIG. 1A is an apparatus including a single lens element, according to embodiments of the present invention.
Figure 1B:
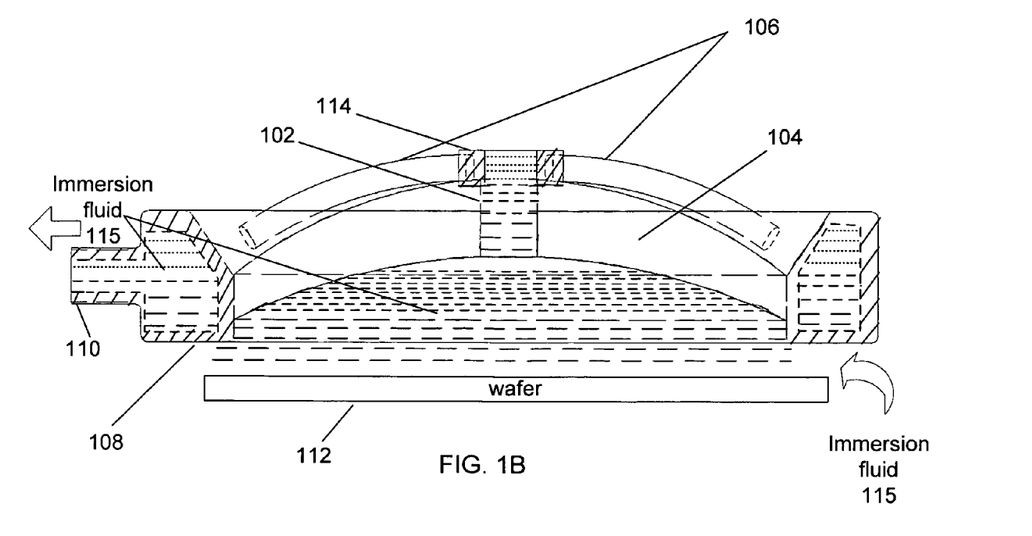
FIG. 1B is a cross section of the apparatus of FIG. 1A through section 1B—1B.

Referring to FIGS. 1A and 1B, a first embodiment of an apparatus 100 in accordance with the present invention is disclosed. Apparatus 100 includes a lens element with a central outlet 102. Central outlet 102 draws gas bubbles from the space between the lens element 104 and wafer 112. Additionally, immersion fluid 115 and any subsequent gas bubbles introduced with immersion fluid 115 may also be drawn from a space between lens element 104 and wafer 112 via central outlet 102. In one embodiment, central outlet 102 may pass through lens element 104, as shown in FIGS. 1A and 1B. Coupled to central outlet 102 may be collector 114 and a plurality of substantially radial passages 106 for drawing the immersion fluid 115 from central outlet 102 to collector ring 108. Collector 114 and the plurality of substantially radial passages 106 may be located relative to a top surface of lens element 104. In one non-limiting example, three radial passages 106 may be used spaced at 120 degree intervals relative to the collector ring 108. A pressure, for example a negative pressure, may be provided to collector ring 108 via a pressurizer, a pump, or other suitable means as known in the art, to maintain and control the fluid flow through central outlet 102 to collector ring 108. A port 110 may also be provided for removing the immersion fluid and any gas present from below lens element 104.

Figure 2A:
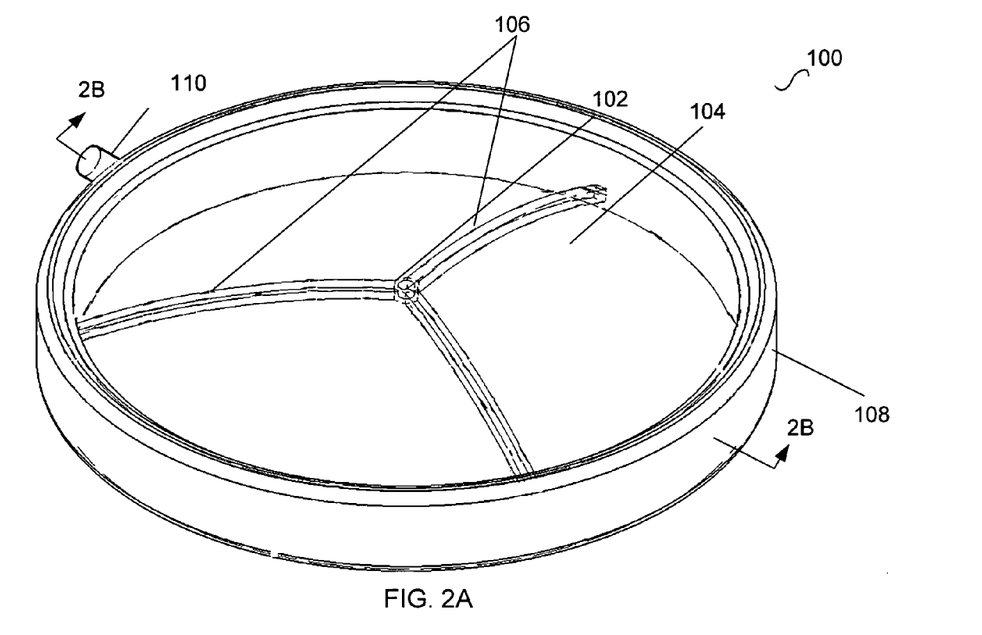
FIG. 2A is an apparatus including a single lens element, according to an embodiment of the present invention.
Figure 2B:
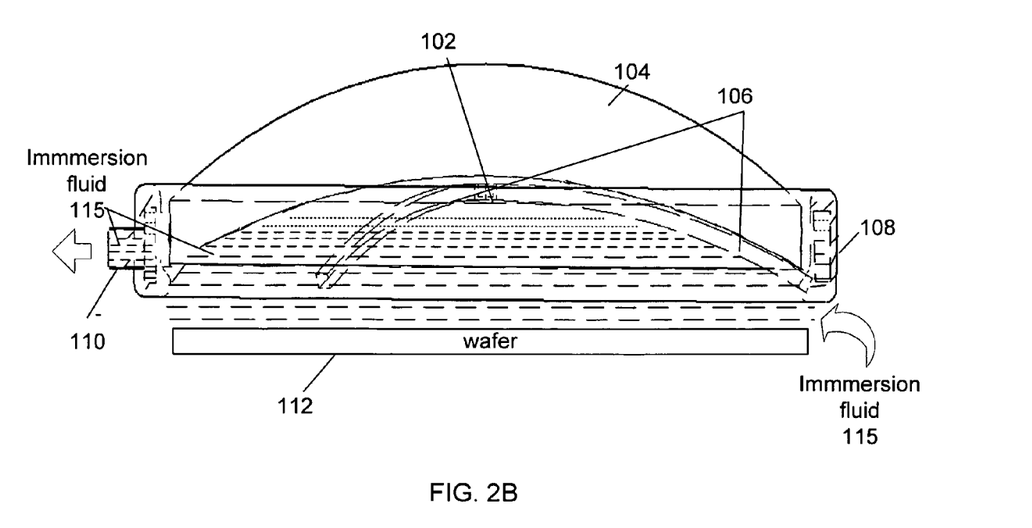
FIG. 2B is a cross section of the apparatus of FIG. 2A through section 2B—2B.
Figure 2C:
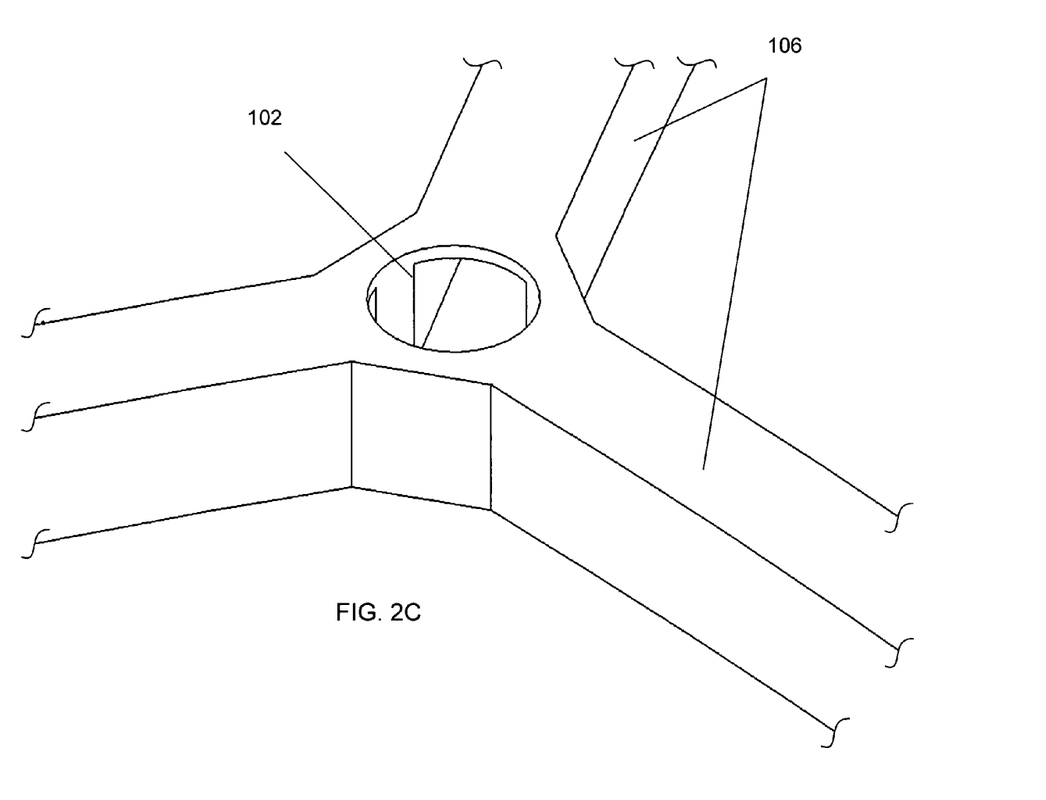
FIG. 2C is a top view of an outlet and passages of the apparatus of FIGS. 2A and 2B, according to an embodiment of the present invention.

In one embodiment, central outlet 102 and the plurality of substantially radial passage 106 may be located relative to a bottom surface lens element 104, as shown in FIGS. 2A, and 2B. Coupled to the top surface of the lens element 104 may be obscuration for blocking light from passing through central outlet 102 during a lithography process. Referring to FIG. 2C, central outlet 102 may have an opening such that the immersion fluid flows up towards the lens element and substantially fills the volume between lens element 104 and wafer 112. Via a pressure provided to collector ring 108, central outlet may also be able to draw gas bubbles present in the space between the lens element and wafer 112 prior to drawing the immersion fluid and also may reduce or substantially eliminate gas bubbles in the immersion fluid 115.

Figure 3A:
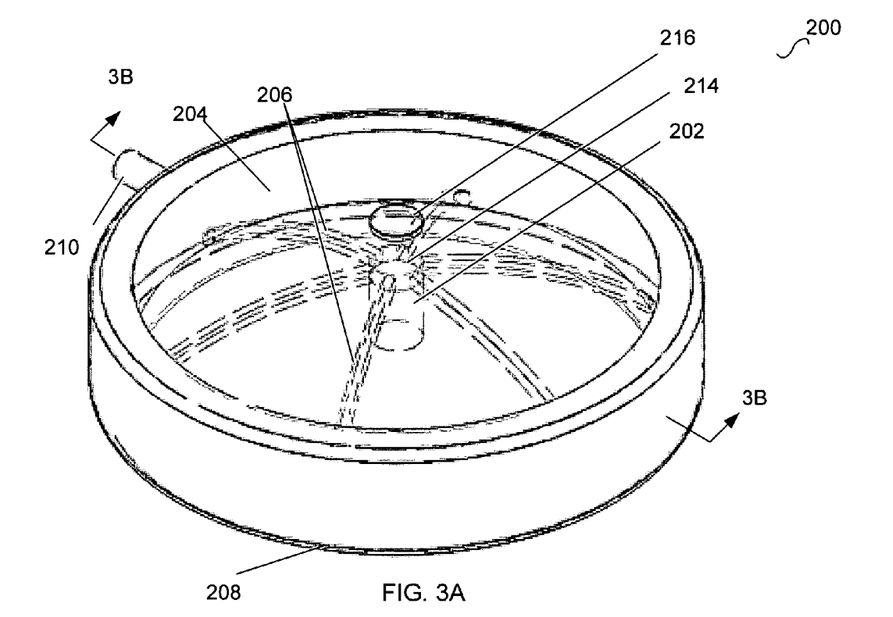
FIG. 3A is an apparatus including a doublet lens element, according to an embodiment of the present invention.
Figure 3B:
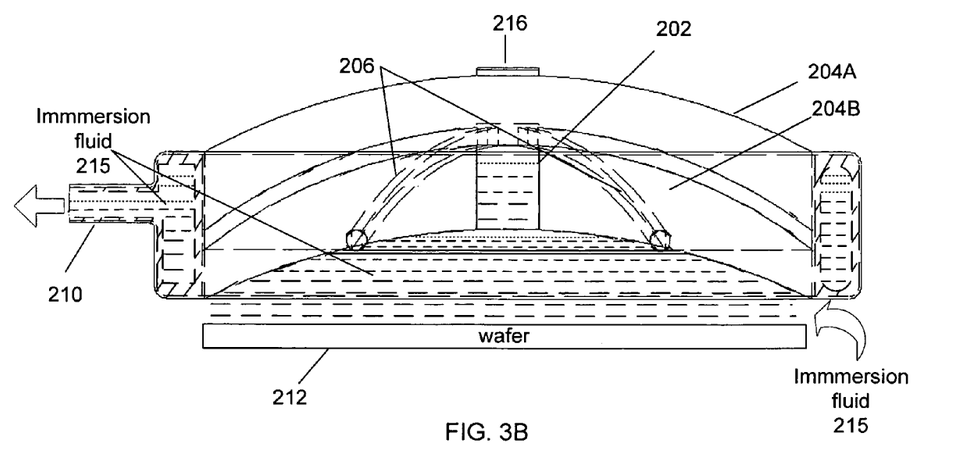
FIG. 3B is a cross section of the apparatus of FIG. 3A through section 3B—3B.

In another embodiment of the invention, an apparatus 200 may include a doublet lens element 204 comprising a first element 204A and a second element 204B, as shown in FIGS. 3A and 3B. Central outlet 202 passes through second element 204B and may draw immersion fluid 215 from a space between doublet lens element 204 and wafer 212, through second lens 204B of doublet lens element 204. The immersion fluid 215 may subsequently flow into plurality of substantially radial passages 206 which may be formed on either a lower surface of first lens 204A or an upper surface of second lens 204B. For example, the plurality of substantially radial passages 206 may be etched, machined or formed by other suitable means known in the art into the lens surface. The plurality of substantially radial passages 206 may transport the immersion fluid 215 a collector ring 208 surrounding doublet lens element 204. In some embodiments, the plurality of substantially radial passages 206 may be coated with an opaque coating to minimize light scatter during the lithography process. Alternatively, the plurality of substantially radial passages 206 may be left-untreated, for example, if the lens element which includes the substantially radial passages is index-matched to immersion fluid 215. Apparatus 200 may also include obscuration 216 coupled to central outlet 202. When present, obscuration 216 blocks light from passing through central outlet 202 during a lithography process.

Figure 4A:
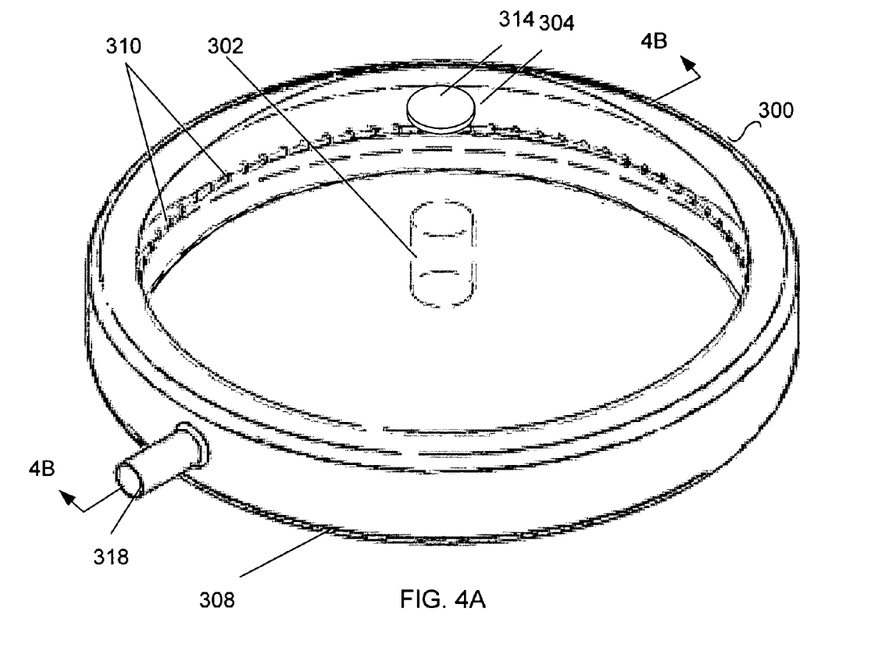
FIG. 4A is an apparatus including a first and second lens element, according to an embodiment of the present invention.
Figure 4B:
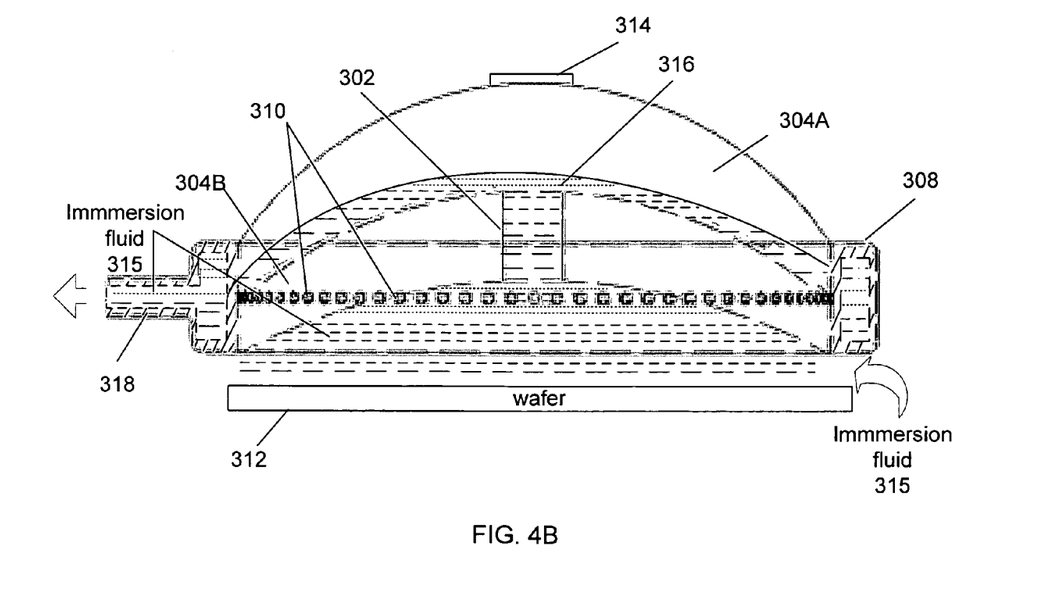
FIG. 4B is a cross section of the apparatus of FIG. 4A through section 4B—4B.

Referring now to FIGS. 4A and 4B, another apparatus 300 is presented according to another embodiment of the present invention. Apparatus 300 includes a lens element 304 comprised of two lens elements 304A and 304B. First lens element 304A and second lens element 304B may be separated by a fluid space 316. A central outlet 302 may pass through second lens 304B, providing a passage for immersion fluid 315 from a space between lens element 304 and wafer 312 to fluid space 316 between first lens element 304A and second lens element 304B. A plurality of holes 310 formed in collector ring 308 may draw the immersion fluid from the fluid space 316 into collector ring 308 and then out through port 318. Coupled to the top surface of first lens element 304A may be obscuration 314 for blocking light from passing through central outlet 302 during a lithography process.

It is noted that the position of central outlet 102, 202, and 302 and radial passages 106, 206, and 306 provided in all the Figures are an illustrative embodiment. It is noted that the outlet may be positioned elsewhere relative to a lens element and there may be more than one outlet used to draw the immersion fluid towards the lens element. Further, radial passages may be any passages that can draw immersion fluid from an outlet.

Figure 5:
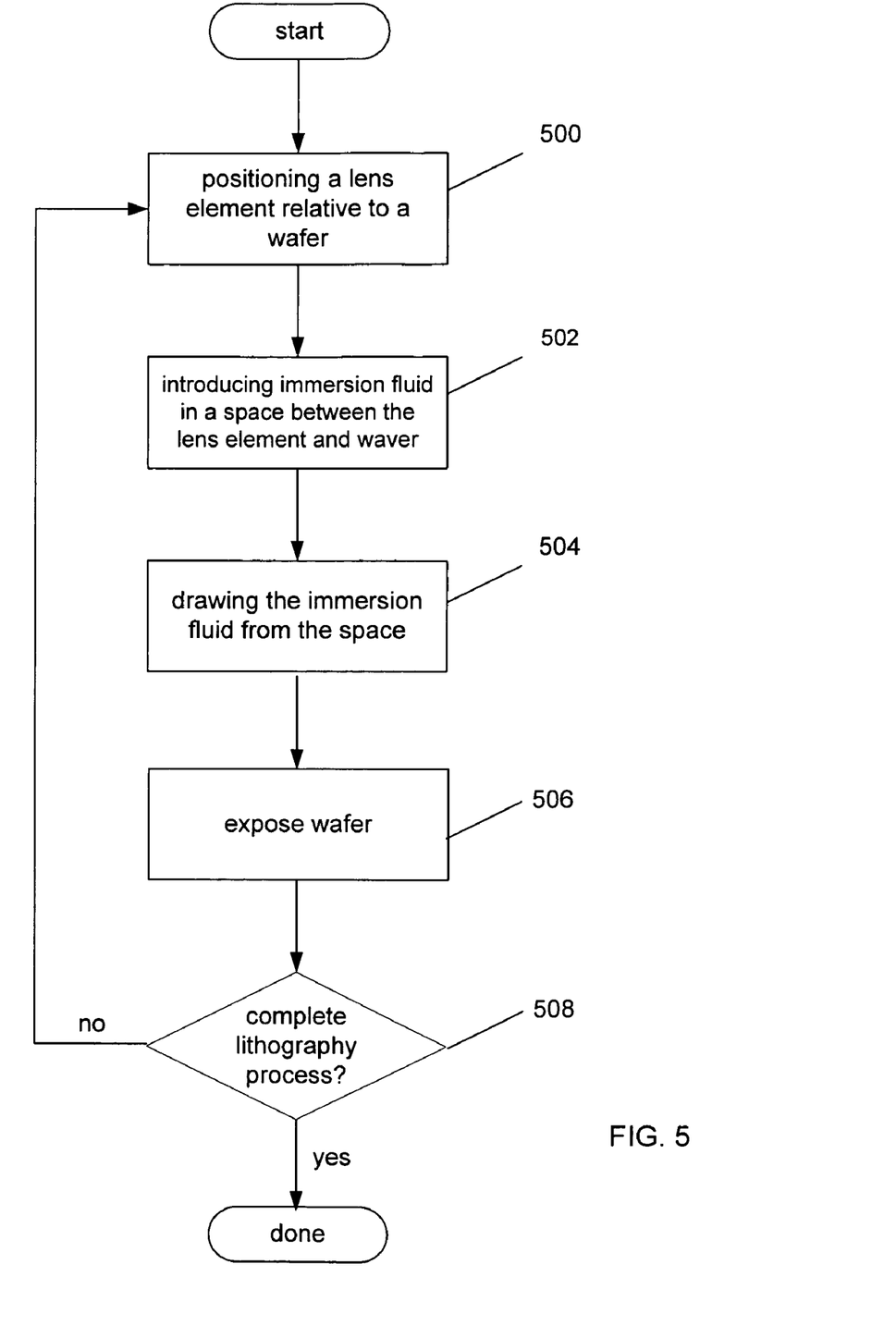
FIG. 5 is a flow chart of a method for immersion lithography, according to the present invention.

Referring to FIG. 5, a flowchart of a method for immersion lithography according to the present invention is shown. To initiate the immersion lithography process, a lens element may be provided and positioned relative to a wafer such that a space may be formed between the lens element and wafer (step 500). The lens element may be situated such that a first site on the wafer may be exposed. Next, an immersion fluid may be introduced to the space between the lens element and wafer (step 502). In some embodiments, during the introduction of the immersion fluid into the space between the lens element and wafer, the air present in the space may also be withdrawn. The immersion fluid may be water, in which the water may include dopants such as organic or inorganic compounds for increasing the refractive index of the water. Such compounds may include, for example, salts. Next, the immersion fluid is drawn from the space towards the lens element to reduce or substantially eliminate gas bubbles that may be present in the immersion fluid (step 504). A pressure, such as a negative pressure, may be provided to accomplish the fluid flow. In some embodiments, the immersion fluid may be drawn from the space towards the non-planar lens element via an outlet. In other embodiments, the immersion fluid may also be drawn through the lens element via an outlet. The drawing of the immersion fluid towards and/or through the lens elements allows immersion fluid to fill the volume underneath the lens element and wafer. Steps 502 and 504 may allow for the removing of gas bubbles in the space between the lens element and wafer and may also capture any bubbles introduces with the immersion fluid.

In some embodiments, the lens element may be a single, non-planar lens element. Other embodiments may include a non-planar, doublet lens element. Alternatively, the lens element may include first and second lens elements such that the immersion fluid may be drawn to a space between the first and second lens elements.

The method may also include a step of drawing the immersion fluid from an outlet. In some embodiments, passages may be provided to draw the immersion fluid from the outlet. The passages may be coupled to the outlet. Alternatively, the passages may be etched into the lens element. During the lithography process, the step of drawing the immersion fluid from the space between the lens element and the wafer and drawing the fluid from the outlet may be maintained while portions of the wafer are exposed (step 506). For example, after the first portion of the wafer is exposed, the wafer may be moved by a stage such that a second exposure site of the wafer is positioned relative to the lens element. If the immersion step is not complete, the wafer is positioned such that a next site on the wafer may be exposed step 508. The fluid flow of the immersion fluid (steps 502 and 504) may be maintained until the wafer is exposed and the immersion lithography process is completed (step 508). As such, the present method provides for use of non-planar lens element, which may enable a higher numerical aperture design.

The above embodiments may allow for the use of high numerical aperture, non-planar lens elements in immersion lithography by substantially eliminating bubbles at a bottom surface, or more particularly, at the center of a bottom surface of a lens element. By drawing the immersion fluid towards or even through the lens element, the fluid flow of the immersion fluid may substantially fill the volume of the area underneath the non-planar lens.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope and concept of the invention as defined by the appended claims.

The invention claimed is:

1. An apparatus comprising:
a non-planar lens element;
a central outlet for drawing immersion fluid through the non-planar lens element to a plurality of substantially radial passages; and
a collector ring coupled to the central outlet for removing the immersion fluid from the central outlet.

2. The apparatus of claim 1, the central outlet further drawing gas bubbles from beneath the non-planar lens element.

3. The apparatus of claim 1, the non-planar lens element comprising a concave lens.

4. The apparatus of claim 1, the non-planar lens element comprising two non-planar lenses spaced apart from one another to form a fluid passage space between the two lenses.

5. The apparatus of claim 4, the collector ring comprising a plurality of holes for draining the immersion fluid from the space between the two non-planar lenses.

6. The apparatus of claim 1, the plurality of substantially radial passages for transporting the immersion fluid from the central outlet to the collector ring.

7. The apparatus of claim 6, the plurality of substantially radial passages being below a bottom surface of the non-planar lens element.

8. The apparatus of claim 1, the plurality of substantially radial passages being above a top surface of the non-planar lens element.

9. The apparatus of claim 1, the non-planar lens element comprising a non-planar doublet lens.

10. The apparatus of claim 9, the non-planar doublet lens comprising a plurality of substantially radial passages etched into one element of the non-planar doublet lens.

11. The apparatus of claim 1 further comprising an exhaust port for drawing the immersion fluid and any gas out from below the non-planar lens element.

12. An apparatus comprising:
a non-planar lens element;
a collector ring surrounding the non-planar lens element;
an outlet passing through the non-planar lens element for conducting immersion fluid; and
a plurality of passages coupled to the outlet and the collector ring for conducting the immersion fluid from the outlet to the collector ring.

13. The apparatus of claim 12, the plurality of passages being above a top surface of the lens element.

14. The apparatus of claim 12, the plurality of passages being below a bottom surface of the lens element.

15. The apparatus of claim 12, further comprising a pump for applying a negative pressure to the collector ring.

16. The apparatus of claim 12, the non-planar lens element comprising a concave lens element.

17. An apparatus comprising:
a non-planar doublet lens element;
a collector ring surrounding the non-planar doublet lens element;
an outlet passing through the non-planar doublet lens element for conducting an immersion fluid; and
a plurality of passages formed on one surface of the non-planar doublet lens element for conducting the immersion fluid from the outlet to the collector ring.

18. The apparatus of claim 17, the non-planar doublet lens element comprising a concave doublet lens element.

19. An apparatus comprising:
a first non-planar lens element;
a second lens non-planar element spaced apart from the first non-planar lens element to form a space between the first and second non-planar lens elements;
an outlet passing through the second non-planar lens element for conducting immersion fluid into the space between the first and second non-planar lens elements; and
a collector ring for conducting the immersion fluid from the space between the first and second non-planar lens element.

20. The apparatus of claim 19, the first and second non-planar lens elements comprising first and second concave lens elements.

21. The apparatus of claim 19, a bottom surface of the second lens element being concaved.

22. The apparatus of claim 19, the collector ring surrounding the first and second non-planar lens elements.

23. An apparatus comprising:
a lens element spaced apart from and juxtapose to a wafer;
a collector ring coupled to the non-planar lens element;
an outlet coupled directly between a bottom surface of the non-planar lens element and a top surface the wafer, the outlet conducting immersion fluid towards the non-planar lens element; and
a plurality of passages coupled to the outlet for conducting the immersion fluid from the outlet to the collector ring.

24. The apparatus of claim 23, the plurality of passages being coupled between to a bottom surface of the lens element and the wafer.

25. The apparatus of claim 23, the outlet being below a center of the bottom surface of the lens element.

26. The apparatus of claim 23, the non-planar lens element comprising a concave lens element.

27. The apparatus of claim 23, the collector ring surrounding the non-planar lens element.

28. A method for immersion lithography comprising:
providing a non-planar lens element;
positioning the non-planar lens element relative to a wafer to form a space between the non-planar lens element and the wafer;
drawing air from the space between the non-planar lens element and the wafer;
introducing immersion fluid into the space
drawing the immersion fluid through the non-planar lens element to minimize gas bubbles in the immersion fluid;
repeating the introducing and drawing steps to maintain a flow of the immersion fluid during immersion lithography.

29. The method of claim 28, the step of drawing air and the step of introducing immersion fluid being simultaneous.

30. The method of claim 28, the immersion fluid comprising water.

31. The method of claim 28, the non-planar lens element comprising a single, non-planar lens.

32. The method of claim 28, the non-planar lens element comprising a concave lens element.

33. The method of claim 28, further comprising providing an outlet, the step of drawing comprising drawing the immersion fluid from the space through the outlet.

34. The method of claim 33, further comprising providing passages for drawing the immersion fluid from the outlet.

35. The method of claim 34, further comprising placing the outlet and passages relative to a bottom surface of the non-planar lens element.

36. The method of claim 34, further comprising placing the outlet and passages relative to a top surface of the non-planar lens element.

37. The method of claim 28, the step of repeating further comprising repeating the step of drawing the immersion fluid from the space between the non-planar lens element and the wafer and drawing the immersion fluid from the outlet until completion of an immersion lithography process.

38. A method for immersion lithography comprising:
providing a non-planar doublet lens element comprising passages;
providing an outlet coupled to the non-planar doublet lens element;
positioning the non-planar lens element relative to a wafer to form a space between the non-planar lens element and the wafer;
drawing air from the space between the non-planar lens element and the wafer;
introducing immersion fluid into the space;
drawing the immersion fluid from the space through the outlet; and
repeating the introducing and drawing steps to maintain a flow of the immersion fluid during immersion lithography.

39. A method for immersion lithography comprising:
providing a non-planar lens element comprising a first and second non-planar lens element spaced apart from one another;
providing an outlet coupled to the non-planar lens element;

positioning the non-planar lens element relative to a wafer to form a space between the non-planar lens element and the wafer;

drawing air from the space between the non-planar lens element and the wafer;

introducing immersion fluid into the space;

drawing the immersion fluid through the outlet to a space between the first and second non-planar lens elements; and repeating the introducing and drawing steps to maintain a flow of the immersion fluid during immersion lithography.

40. An apparatus comprising:

a non-planar doublet lens comprising a plurality of substantially radial passages etched into one element of the non-planar doublet lens;

a central outlet for drawing immersion fluid towards the non-planar doublet lens element; and a collector ring coupled to the central outlet for removing the immersion fluid from the central outlet.

\* \* \* \* \*

UNITED STATES PATENT AND TRADEMARK OFFICE
CERTIFICATE OF CORRECTION

| | | |
|---|---|---|
| PATENT NO. | : 7,128,427 B2 | Page 1 of 1 |
| APPLICATION NO. | : 10/981884 | |
| DATED | : October 31, 2006 | |
| INVENTOR(S) | : Christian K. Van Peski and Walter J. Trybula | |

It is certified that error appears in the above-identified patent and that said Letters Patent is hereby corrected as shown below:

Column 7, line 44, please delete "element" and insert --elements--.

Column 7, line 56, please delete "a top surface the wafer" and insert -- a top surface of the wafer-- .

Column 7, line 64, please delete "to" after "between".

Column 8, line 12, please add --;-- after "space".

Signed and Sealed this

Twelfth Day of June, 2007

JON W. DUDAS
*Director of the United States Patent and Trademark Office*